United States Patent
Tomura et al.

[11] Patent Number: 5,940,679
[45] Date of Patent: Aug. 17, 1999

[54] METHOD OF CHECKING ELECTRIC CIRCUITS OF SEMICONDUCTOR DEVICE AND CONDUCTIVE ADHESIVE FOR CHECKING USAGE

[75] Inventors: Yoshihiro Tomura; Yoshihiro Bessho; Yoshifumi Nakamura, all of Osaka, Japan

[73] Assignee: Matsushita Electric Industrial Co., Ltd., Osaka, Japan

[21] Appl. No.: 08/577,485

[22] Filed: Dec. 22, 1995

[30] Foreign Application Priority Data

Jan. 6, 1995 [JP] Japan ..................................... 7-000665

[51] Int. Cl.⁶ .............................. H01L 21/66; H05K 3/34
[52] U.S. Cl. ............................. 438/15; 438/18; 438/108; 438/109; 438/119; 438/614; 438/615
[58] Field of Search .............................. 438/18, 119, 614, 438/615, 15, 108, 109

[56] References Cited

U.S. PATENT DOCUMENTS

| | | |
|---|---|---|
| 4,822,523 | 4/1989 | Prud'Homme . |
| 4,975,079 | 12/1990 | Beaman et al. . |
| 4,975,637 | 12/1990 | Frankeny et al. . |
| 5,206,585 | 4/1993 | Chang et al. . |
| 5,237,269 | 8/1993 | Aimi et al. . |
| 5,289,631 | 3/1994 | Koopman et al. . |
| 5,315,241 | 5/1994 | Ewers . |
| 5,475,317 | 12/1995 | Smith . |

FOREIGN PATENT DOCUMENTS

| | | |
|---|---|---|
| 0 372 519 | 6/1990 | European Pat. Off. . |
| 0 454 005 | 10/1991 | European Pat. Off. . |
| 0 467 119 | 1/1992 | European Pat. Off. . |
| 0 520 841 | 12/1992 | European Pat. Off. . |
| 0 708 582 | 4/1996 | European Pat. Off. . |
| 34 43 789 | 4/1985 | Germany . |
| 3-19251 | 1/1991 | Japan . |
| 5-136146 | 6/1993 | Japan . |
| WO 91/18957 | 12/1991 | WIPO . |

OTHER PUBLICATIONS

Jul. 22, 1998 Communication from European Patent Office and attached Search Report.

*Primary Examiner*—David E. Graybill
*Attorney, Agent, or Firm*—Merchant & Gould P.C.

[57] ABSTRACT

Conductive adhesive for checking electric circuits is formed on contact electrodes of a chip package or a multi-chip module. After contact electrodes of the chip package or the multi-chip module are set on terminal electrodes of a checking device in a correct position, the chip package or the multi-chip module is mounted on the checking device, so that the contact electrodes are electrically connected to the terminal electrodes with the conductive adhesive in-between, and thus the electric circuits of the chip package or the multi-chip module are checked.

9 Claims, 10 Drawing Sheets

METHOD OF CHECKING ELECTRIC CIRCUITS OF SEMICONDUCTOR DEVICE AND CONDUCTIVE ADHESIVE FOR CHECKING USAGE

FIELD OF THE INVENTION

This invention relates to a method of checking the electric circuits of a semiconductor device and a conductive adhesive for checking the electric circuits. Particularly, this invention relates to a method of checking the electrical operations of a chip package in which an LSI chip is mounted on a chip carrier or a multi-chip module in which multiple LSI chips are mounted on a chip carrier, and a conductive adhesive for checking the package and the module.

BACKGROUND OF THE INVENTION

Soldering was widely used for mounting onto a circuit substrate of a semiconductor device. However, semiconductor devices have been packaged and modularized lately, so that methods of connecting contact electrodes of a chip package or module to terminal electrodes of a circuit substrate were devised.

Among the methods, a method of carrying out operation tests by mounting a package or a module having ball-type solder as contact electrodes on a socket applied to check a semiconductor device called the BGA (Ball Grid Array) socket was found effective since the socket has high contact reliablity and endurance. (As an example, the socket is "TEXTOOL" BGA Socket (IC Socket for test and burn-in) manufactured by Sumitomo 3M Limited.)

An embodiment of the above-noted conventional method of checking a semiconductor device is explained by referring to the figures.

FIG. 7 is a perspective view of a conventional socket for checking a semiconductor device. FIG. 8 is an exploded perspective view of the conventional socket shown in FIG. 7. In FIG. 7 and FIG. 8, 101 is a lid, 102 is a latch, 103 is a nest, 104 is a contact pin, 105 is a base, and 106 is the BGA socket.

FIG. 9 is a cross-sectional view of the socket as used with a semiconductor device. FIG. 10 is an enlarged cross-sectional view of part of FIG. 9. In FIG. 9 and FIG. 10, 107 is an LSI chip, 108 is a two-stage protruded electrode, 109 is a bonding layer made of conductive adhesive, 110 is a terminal electrode of a chip carrier, 111 is a chip carrier, 112 is a ball-type protruded electrode, 113 is a spacer, and 114 is a semiconductor device.

The conventional method of checking a semiconductor device is explained by referring to FIGS. 7, 8, 9 and 10.

The BGA socket is prepared as shown in FIG. 7 and FIG. 8. As shown in FIG. 9 and FIG. 10, the position of ball-type protruded electrodes 112 of package or module 114 is adjusted to contact pins 104 of BGA socket 106, facing the contact pins. Then, the protruded electrodes are placed on the contact pins. Spacers 113 are deposited on chip carrier 111 and are pressed from the top by lid 101, with lid 101 being fixed by latch 102. As a result, ball-type protruded electrodes 112 of package or module 114 are set in contact with contact pins 104, so that electric continuity is established and the semiconductor device is checked electrically.

However, the following problems are found in the above-mentioned method:

1. the chip carrier where an LSI chip is mounted is pressed with a large load of several kg, so that the substrate is bent and the connection of the LSI chip becomes unstable;

2. the ball-type protruded electrodes are applied as contact electrodes, so that the protruded electrodes cannot sufficiently contact the contact pins of the BGA socket when the electrodes are not perfectly identical to each other; and 3. the contact pin of the BGA socket is in a spring form, so that the height of the pin is required to be more than 100 $\mu$m to increase contact between the pin and the protruded electrode.

SUMMARY OF THE INVENTION

It is an object of this invention to solve the above-mentioned conventional problems by providing a method of checking electric operations of a chip package or a multi-chip module, and a conductive adhesive for checking the package or module. In the method, the contact electrodes of a chip carrier and the terminal electrodes of a checking device should be electrically connected quickly and stably via the conductive adhesive without reducing the connection stability of an LSI chip on the chip carrier of the chip package or the multi-chip module.

In order to accomplish this and other objects, the contact electrodes are formed on a surface of the chip carrier opposite to the surface where the LSI chip or chips are formed to be mounted on a circuit substrate. In the chip package, an LSI chip is mounted on a chip carrier. In the multi-chip module, a plurality of LSI chips are mounted on a chip carrier.

First, the conductive adhesive is formed by a transfer method or a printing method onto protruded electrodes, preferably ball-type protruded electrodes that are formed on the contact electrodes of the chip package or the multi-chip module.

After adjusting the positions between the terminal electrodes on the checking device and the ball-type protruded electrodes, the protruded electrodes are placed on the terminal electrodes. Therefore, the protruded electrodes are electrically connected to the terminal electrodes with the conductive adhesive in-between, thereby checking a semiconductor device.

In this invention, the load pressing the chip package or the multi-chip module is small, so that the contact electrodes are electrically connected to the terminal electrodes via the conductive adhesive without bending the chip carrier and reducing the connection stability of the LSI chip on the chip carrier. Therefore, the operations of the chip package or the multi-chip module can be checked precisely.

With the application of the conductive adhesive, contact between the terminal electrodes and the protruded electrodes becomes stable and the checking of the operations of the package or the module become possible.

The conductive adhesive can be formed on the contact electrodes easily, and the electric connection is preferable in operation or function tests. Thus, the operations of a semiconductor device in which an LSI chip or a chip carrier are included are smoothly and precisely checked. Since the contact electrodes of the chip package or the multi-chip module are ball-type, the conductive adhesive can be easily formed on the electrodes by a transfer method or a printing method. As a result, the contact electrodes are electrically connected to the terminal electrodes of the checking device simply by mounting them on the terminal electrodes, thus easily carrying out the electric operation or function tests for the semiconductor device.

According to this invention, it becomes easy to replace the LSI chip or the chip carrier that was found NG in the checking process, so that the invention has significant practical benefits.

The conductive adhesive is formed so as to establish electric continuity between the contact electrodes of the chip package or the multi-chip module that are formed on a surface opposite to a surface provided with an LSI chip or LSI chips, and the terminal electrodes of a checking device. The adhesive is made mainly of a conductive filler and resin, so that it can reduce the load applied to the chip carrier during a checking process. The adhesive absorbs load added to the chip carrier due to the elasticity of the resin. In addition, an electrical connection is established even at ordinary temperatures by the contact with the conductive filler.

The weight ratio of said conductive filler and said thermoplastic resin contained in said conductive adhesive is preferably 8:2 to 9.5:0.5. It is also preferable that the conductive filler is at least one material selected from the group consisting of Ag, Cu, Ag-Pd, and Au. Thus, the connection stability between the the contact electrodes of the chip package or the multi-chip module and the terminal electrodes of the checking device is ensured.

When the resin of the conductive adhesive includes solvent and thermoplastic resin, electric continuity is established at ordinary temperatures during the process of connecting the contact electrodes of the chip package or the multi-chip module and the terminal electrodes of the checking device. Therefore, checking becomes fast. By using thermoplastic resin, the adhesive strength of the adhesive is small, so that the contact electrodes can be easily removed from the checking device after the checking process.

If the volume resistivity of the conductive adhesive at ordinary temperatures is less than $3 \times 10^{-3} \Omega \cdot cm$, an electric continuity can be established and the semiconductor device can be checked in a short period. This is because the volume resistivity at ordinary temperatures is low during the process of connecting the contact electrodes of the chip package or the multi-chip module to the terminal electrodes of the checking device via the conductive adhesive.

The conductive adhesive preferably contains at least one resin selected from the group consisting of polyester, polyamide, polyvinyl chloride, polyacrylic ester and polymethacrylic ester, so that the contact electrodes are stably connected to the terminal electrodes, and stress added to the chip carrier during a checking process is absorbed by the flexibility of the resin. Conventional problems of generating cracks due to stress caused by adding load to joints between the electrodes of an LSI chip and the solder, the joints of the solder itself and the joints between the solder and the terminal electrodes of the chip carrier during the checking process are solved by this invention since the contact electrodes are connected to the terminal electrodes via the conductive adhesive and load stress during the checking process is reduced.

In this invention, the operations of the chip package can be checked by the checking device without being sealed, so that the time required in the conventional methods of checking after completing sealing is reduced and it becomes possible to replace the LSI chip or a chip carrier that was found NG after the checking process.

DETAILED DESCRIPTION OF THE INVENTION

This invention will be described by referring to the following illustrative examples and attached figures.

EXAMPLE 1

Figure 1:
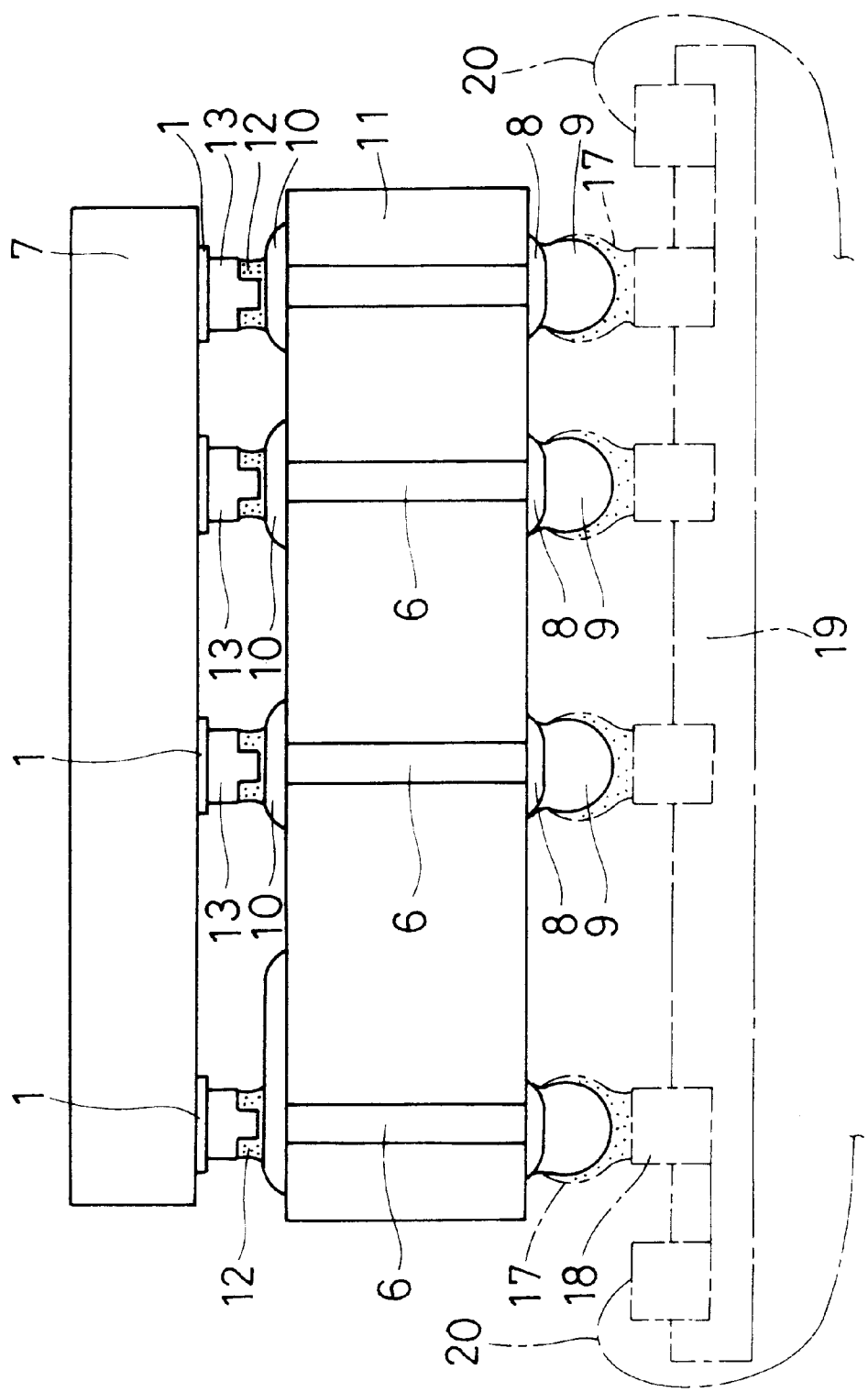
FIG. 1 is a cross-sectional view of a chip package of one embodiment of the invention.
Figure 2A:
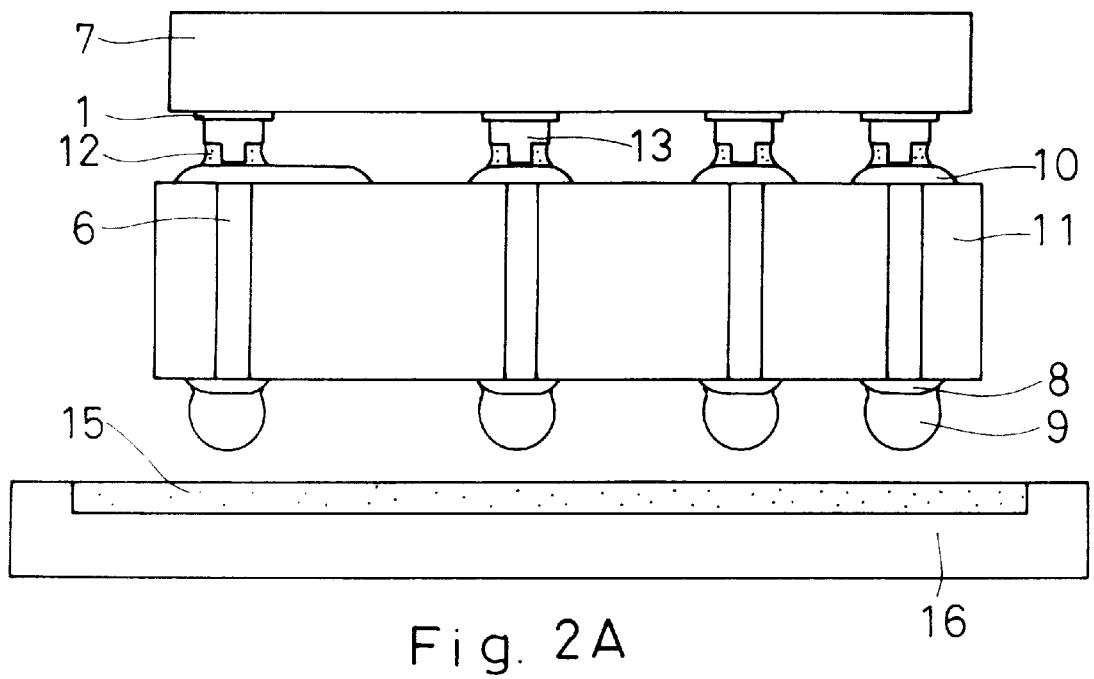
FIG. 2A, 2B, 3A and 3B show a process of checking a chip package of the invention.
Figure 2B:
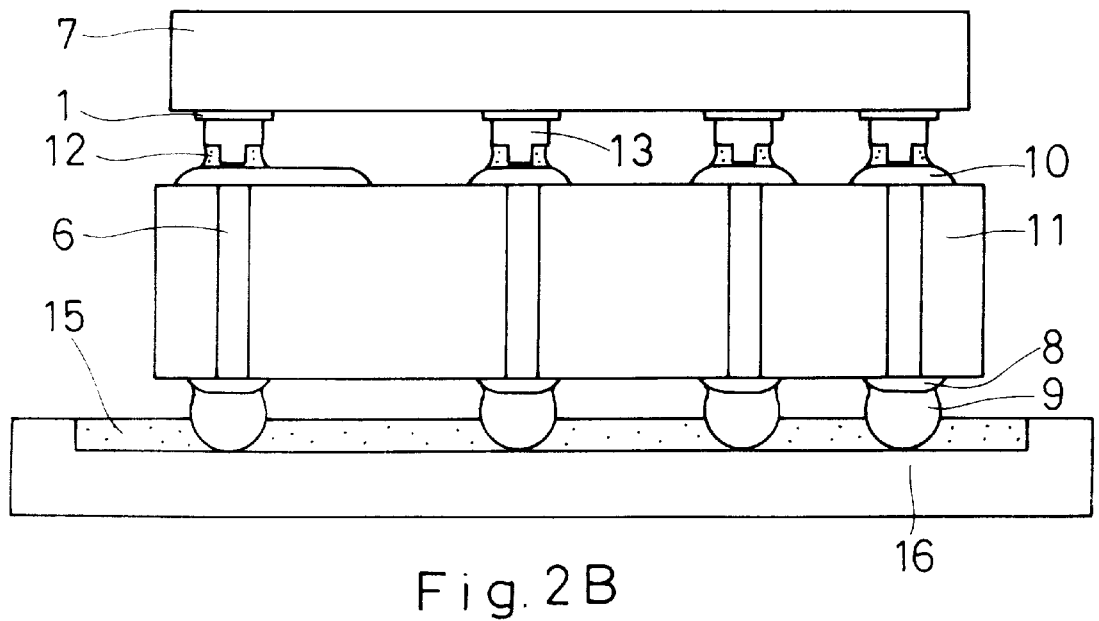
Figure 3A:
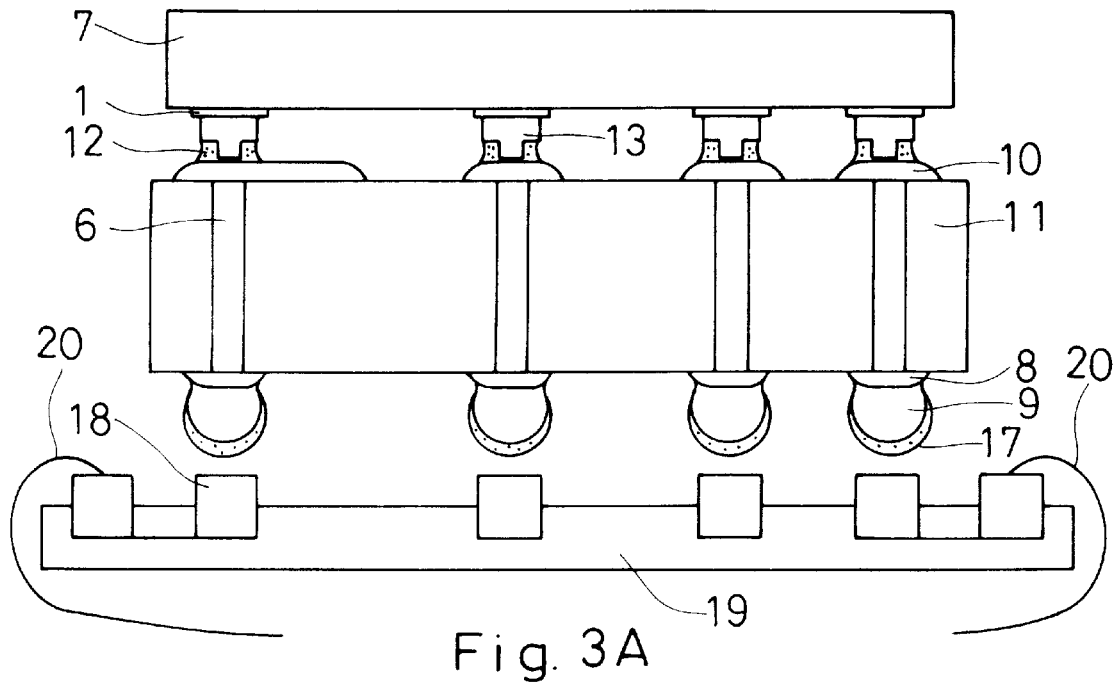
Figure 3B:
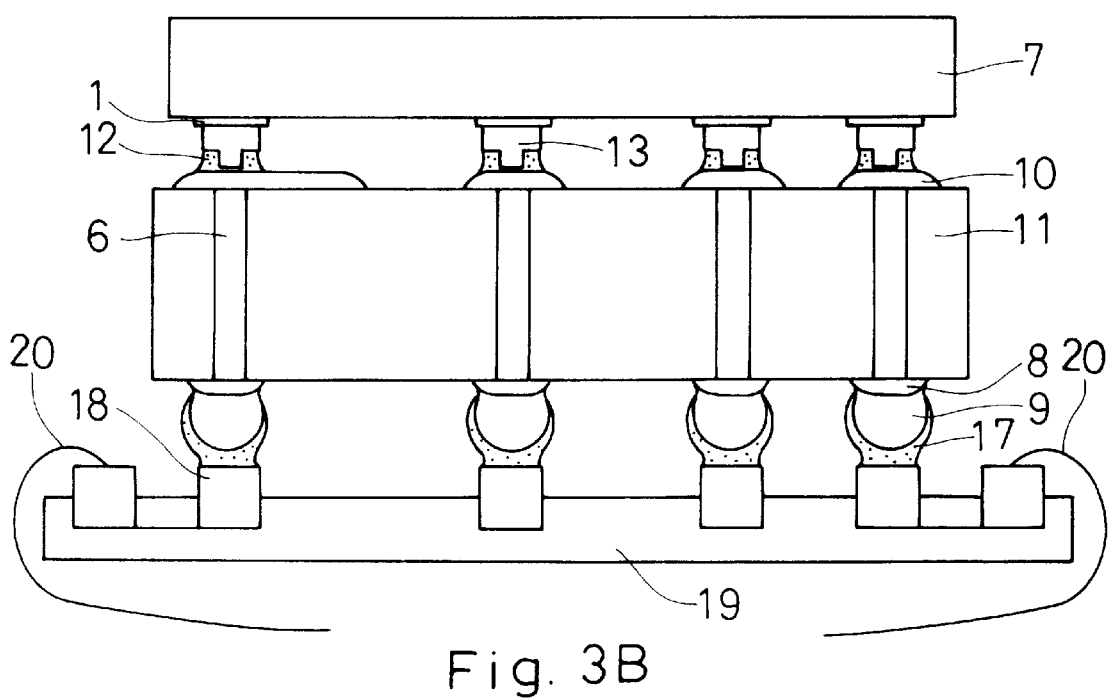

FIG. 1 shows a cross-sectional view of the chip package of the example. FIGS. 2A and 2B show a process of checking the chip package. FIGS. 3A and 3B show another process of checking the chip package.

In FIG. 1, numeral 1 is an electrode pad of an LSI chip, 6 is a via hole, 7 is an LSI chip, 8 is a contact electrode, 9 is a ball-type protruded electrode, 10 is a terminal electrode of a chip carrier, 11 is a chip carrier, 12 is conductive adhesive, 13 is a two-stage protruded bump, 17 is conductive adhesive for checking a semiconductor device, 18 is a terminal electrode of a checking device, and 19 is the checking device. In FIGS. 2A, 2B, 3A and 3B, numeral 15 is a conductive adhesive film for checking a semiconductor device, 16 is a film forming tool, 17 is conductive adhesive for checking a semiconductor device, 18 is a terminal electrode of a checking device, 19 is the checking device, and 20 is a lead.

As shown in FIG. 1, terminal electrodes 10 are formed on the surface of a chip carrier 11 made of ceramic or resin so as to mount an LSI chip 7 on the chip package. In addition, contact electrodes 8 are formed on a surface opposite to the surface with mounted LSI chip 7, thus mounting the contact electrodes on a circuit substrate.

Terminal electrode 10 and contact electrode 8 are electrically connected to each other by via holes 6. Soldering paste is formed on contact electrodes 8 by printing or transferring. Solder balls having a higher melting point than the paste are adhered to the paste, and ball-type protruded electrodes 9 are then formed by melting the soldering paste, thus forming contact electrodes.

Terminal electrodes 10, contact electrodes 8 and via holes 6 are made of a conductive material such as Cu, Ag and Au.

An LSI chip is formed by transferring or printing a bonding layer made of conductive adhesive 12 onto a two-stage protruded bump 13. The LSI chip is mounted on terminal electrodes 10 of chip carrier 11, and is facing the terminal electrodes. As a result, the chip package is prepared. The chip package is placed in a drier, and conductive adhesive 12 is cured by heat, so that two-stage protruded bumps 13 and terminal electrodes 10 of chip carrier 11 are electrically connected.

Ball-type protruded electrodes 9 are electrically connected to terminal electrodes 18 of a checking device 19 by conductive adhesive 17, thus checking the chip package operation.

A method of checking electric circuits of a semiconductor device is explained by referring to FIGS. 2A, 2B, 3A and 3B.

A film 15 made of conductive adhesive for checking usage is provided in a reservoir in film forming tool 16. As shown in FIG. 2B, the ball-type protruded electrodes 9 of the chip package with cured conductive adhesive 12 are dipped and held in film 15 made of conductive adhesive and are then lifted; thus conductive adhesive 17 is transferred and formed onto the ball-type protruded electrodes 9 of the chip package.

The position of terminal electrodes 18 of checking device 19 is adjusted to that of the chip package (FIG. 3A). The terminal electrodes are placed on checking device 19, and ball-type protruded electrodes 9 are electrically connected to terminal electrodes 18 of the checking device with conductive adhesive 17 in-between (FIG. 3B). The operations and functions of the chip package are then tested.

After the operations are confirmed and the package is found to be a good product, a gap between LSI chip 7 and chip carrier 11 is filled and sealed with sealing resin. Then, the resin is cured with heat. The LSI chip is sealed, so that it can absorb the warp of the chip carrier even if the chip package is checked by an ordinary BGA checking socket after sealing the chip. When the heights of ball-type protruded electrodes 9 are uneven, the package can be repeatedly checked by the above-noted method after sealing.

When a heater (of ordinary temperature to about 100° C.) is built into checking device 19, the solvent in the conductive adhesive can be rapidly removed after depositing the chip package on the checking device. Thus, the connection resistivity of conductive adhesive 17 can be reduced quickly, so that noise is reduced and precise checking at a higher frequency is carried out.

In a good chip package, the gap between LSI chip 7 and chip carrier 11 is filled and sealed with resin, and the resin is cured by heat. Before mounting ball-type protruded electrodes 9 on the terminal electrodes of the circuit substrate, conductive adhesive 17 transferred onto the edge of ball-type protruded electrodes 9 may be washed with the same solvent as the solvent included in the adhesive. Since thermoplastic resin is included in the conductive adhesive, conductive adhesive 17 can be washed with the solvent after curing the resin with heat. Thus, conductive adhesive 17 may be wiped off with solvent absorbed in a "Q-tip" type swab or can be removed by dipping and holding the chip package in the solvent while ultrasonic energy is applied.

The sealing resin applied to the chip package is resistant to the solvent contained in the conductive adhesive.

By making the layer of conductive adhesive 15 thicker than the total dispersion of height dispersion of the contact electrodes 8 of chip package and height dispersion of the terminal electrodes 18 of the checking device, open circuit failure will not occur when the circuit substrate of the chip package is mounted on the terminal electrodes.

Even if ball-type protruded electrodes 9 are not formed on contact electrodes 8 of the chip package, the chip package can be checked by the formation of suitable conductive adhesive 17 on contact electrodes 8.

EXAMPLE 2

Figure 4:
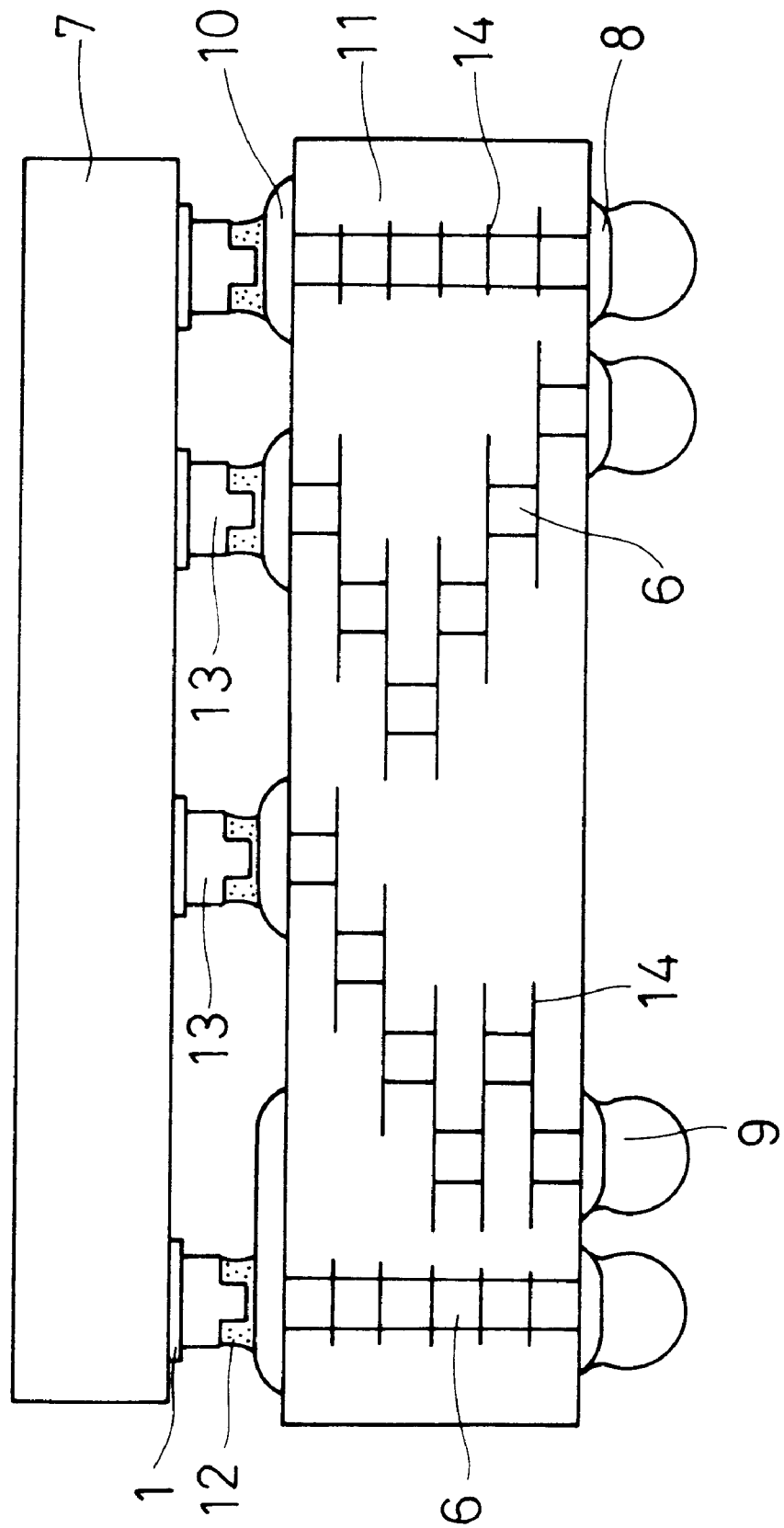
FIG. 4 is a cross-sectional view of a chip package of an embodiment of the invention before a checking process.

FIG. 4 is a cross-sectional view of a chip package of this example before being checked. The same members as in FIG. 1 are indicated with the same numbers; hence those members are not explained.

In FIG. 4, 14 is a substrate inner layer electrode, and each via hole 6 is connected one after another by substrate inner layer electrode 14 applied at each layer.

The difference between the chip package of Example 1 and that of Example 2 is that terminal electrodes 10 of chip carrier 11 are connected to contact electrodes 8 only by via holes 6 in FIG. 1, and they are connected to the electrodes by via holes 6 and substrate inner layer electrodes 14 in this example.

The chip carrier is made of a multilayer substrate in this example. Even if a warp is formed with the multilayer substrate, load added to the chip carrier during a checking process is absorbed by the elasticity of resin contained in the conductive adhesive, since the terminal electrodes are connected to the contact electrodes via the conductive adhesive.

EXAMPLE 3

Figure 5:
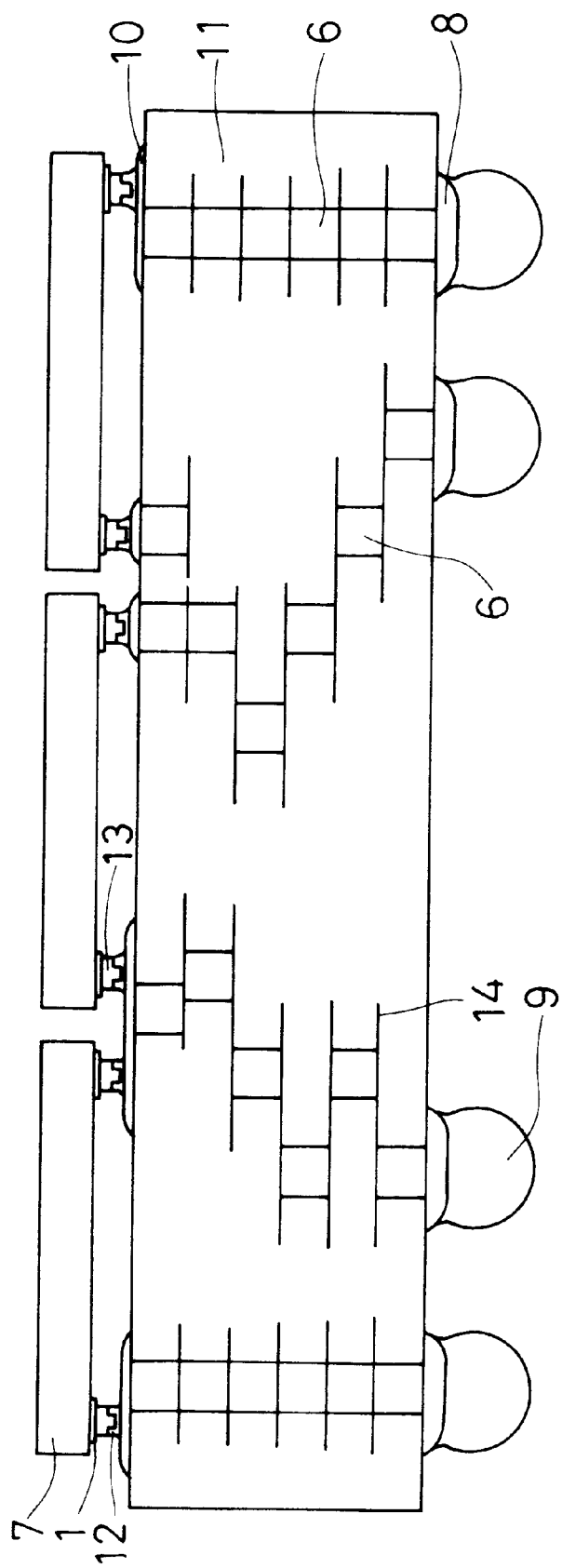
FIG. 5 is a cross-sectional view of a mult-chip module of an embodiment of the invention before a checking process.

FIG. 5 is a cross-sectional view of a multi-chip module that can be used with the present invention. The members mentioned in FIG. 1 have the same numbers and functions as in FIG. 5. Unlike in Example 1 where only one chip is mounted on the carrier, a plurality of LSI chips 7 (three LSI chips) are mounted on a chip carrier 11 in this example.

Stress due to the checking load normally is found at the edges of the substrate by checking the module with an ordinary socket. However, when connecting the contact electrodes to the terminal electrodes by the conductive adhesive, the checking load added to the chip carrier can be reduced, thus reducing any decrease in the binding stability of LSI chips mounted on the chip carrier.

EXAMPLE 4

Figure 6:
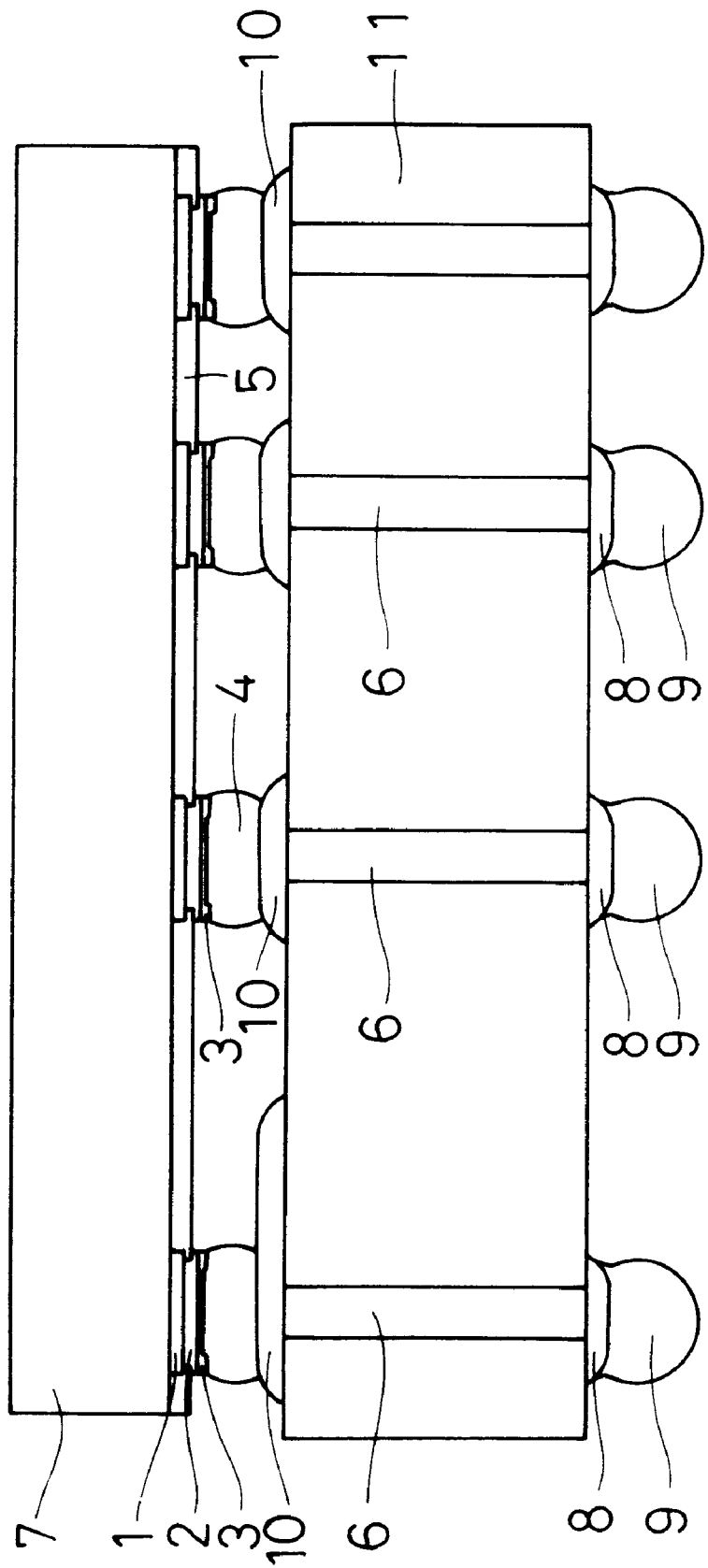
FIG. 6 is a cross-sectional view of a chip package of an embodiment of the invention before a checking process.
Figure 7:
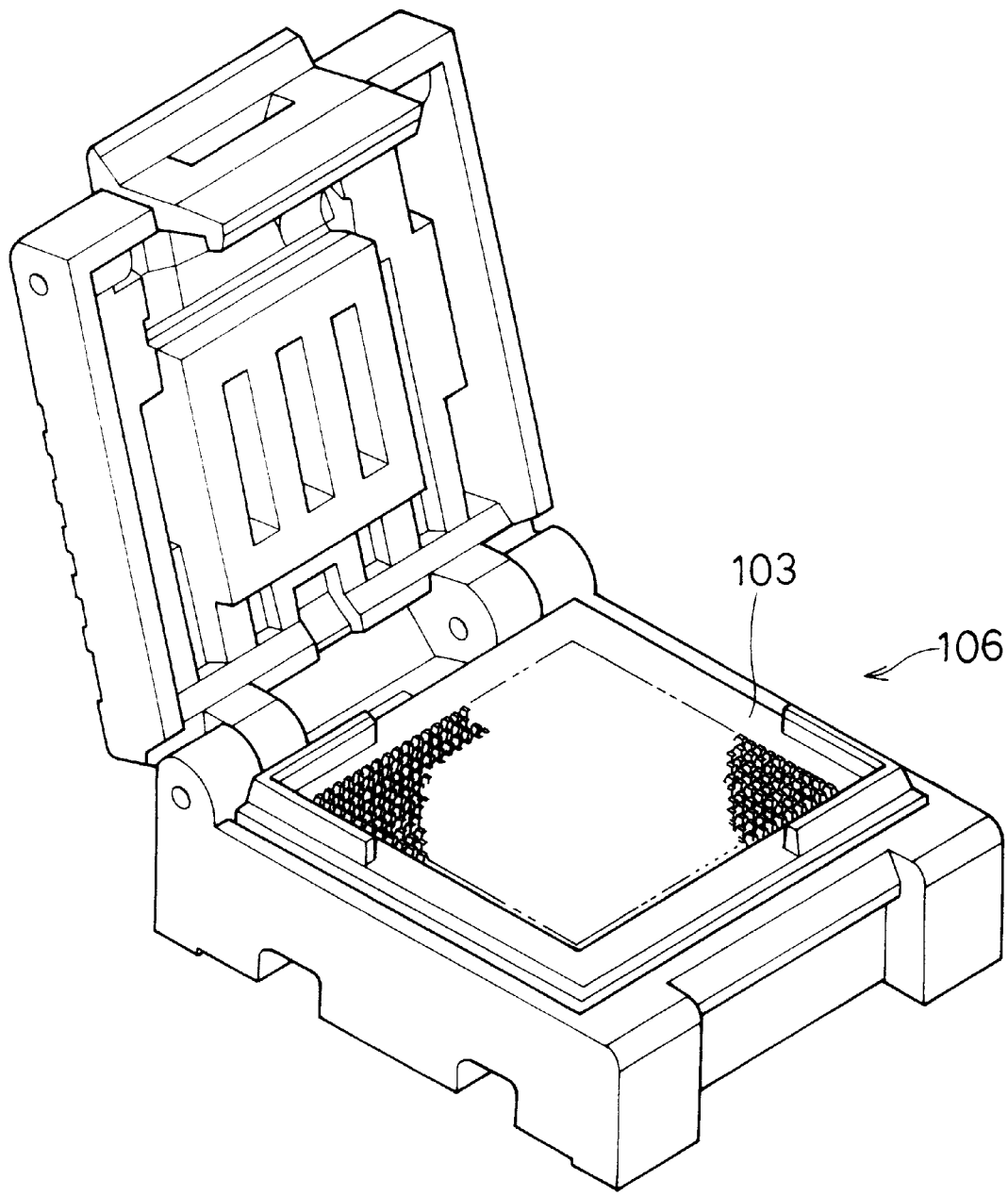
FIG. 7 is a perspective view of a socket for checking a semiconductor device in the prior art.
Figure 8:
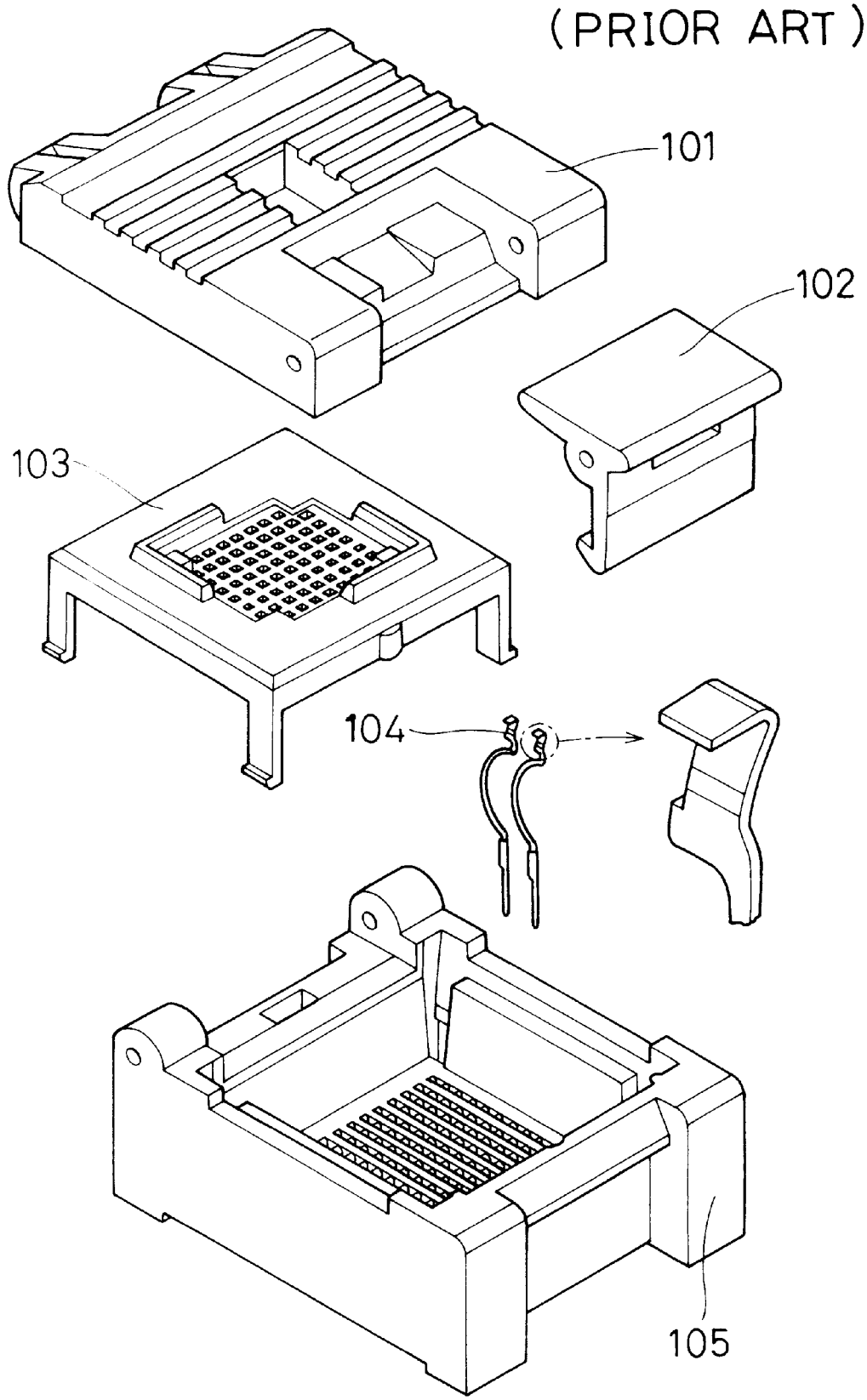
FIG. 8 is an exploded perspective view of the socket shown in FIG. 7.
Figure 9:
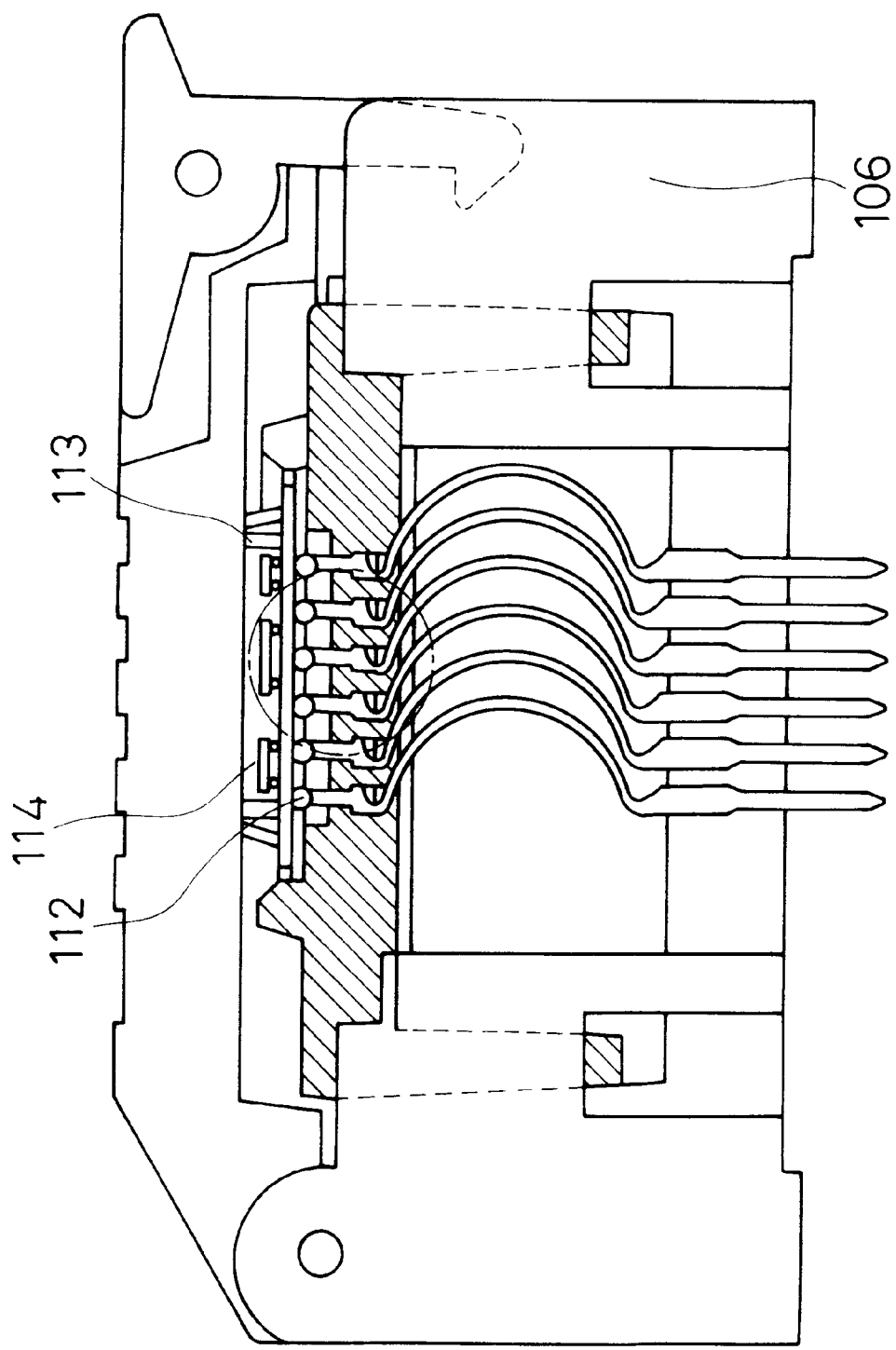
FIG. 9 is a cross-sectional view of the socket shown in FIG. 7 that is applied to a semiconductor device.
Figure 10:
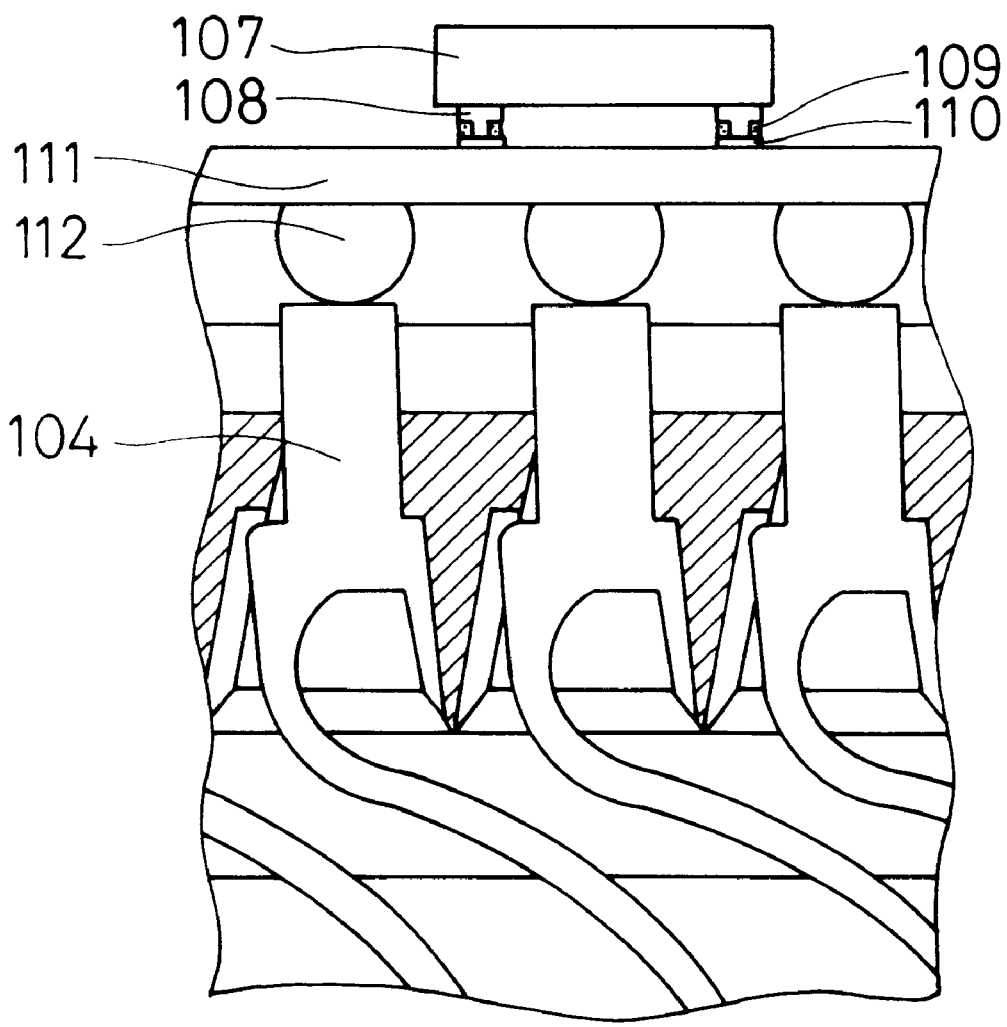
FIG. 10 is an enlarged cross-sectional view of FIG. 9.

FIG. 6 is a cross-sectional view of a chip package that can be used with the present invention. The members mentioned in FIG. 1 have the same numbers and functions as in FIG. 6.

In FIG. 6, numeral 2 is an adhesive metallic film, 3 is a diffusion preventing metallic film, 4 is a soldering bump after melting, and 5 is a passivation film.

While electrode pads 1 of LSI chip and terminal electrodes 10 on the chip carrier are Au two-stage protruded electrodes and conductive adhesive in Example 1, they are fixed by soldering in this example.

The method of preparing conductive adhesive applied to check a semiconductor device can be a printing or transferring method. The substrate material of the chip carrier may be glass, ceramic, alumina or resin.

The LSI chip may be mounted on the terminal electrodes via binding layers made of conductive adhesive, solder or anisotropic conductive material, facing the terminal electrodes.

The conductive filler contained in the conductive adhesive may be at least one material selected from the group consisting of Ag, Cu, Ag-Pd and Au.

The conductive filler may be the mixture of rough filler and fine filler, and may have a minute structure, thus providing a large contact efficiency between these fillers for improved electric and temperature properties.

The conductive adhesive for checking usage should include solvent and thermoplastic resin so as to have flexibility during the checking process.

The conductive adhesive should have less than $3\times10^{-3}\Omega\cdot cm$ volume resistivity at normal temperature.

The conductive adhesive should include at least one resin selected from the group consisting of polyester, polyamide, polyvinyl chloride, polyacrylic ester and polymethacrylic ester.

The contact electrodes of the chip carrier are made of any material that can be formed by a print-baking or plating method, such as Cu, Ag and solder.

The plating material for the contact electrodes of the chip carrier can be any material that can be plated, such as Au, Cu, Ag and solder.

The plating material for the terminal electrodes of the check equipment can be any material that can be plated, such as Au, Cu, Ag and solder.

When the inside conductor of the contact electrodes is made of a base metal, the electric connection of the conductive adhesive can be improved by plating with a non-oxidizing conductor such as Au before applying the conductive adhesive.

As long as the method of mounting a flip chip on a chip carrier is a face-down mounting method such as a plating method, a ball bonding method and a soldering method, the method is not particularly limited in this invention.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method of checking an electric circuit of a chip package in which an LSI chip is mounted on a chip carrier or of a multi-chip module in which a plurality of LSI chips are mounted on a chip carrier, the chip package or multi-chip module being provided with contact electrodes, the contact electrodes being formed on a surface of the chip carrier opposite to a surface on which the LSI chip or chips is mounted, the method comprising:

forming a layer of conductive adhesive on the contact electrodes of the chip package or multi-chip module;

placing the chip package or multi-chip module in a circuit checking device having terminal electrodes, with the contact electrodes in a position corresponding to the position of the terminal electrodes of the checking device; and checking operation of the chip package or multi-chip module after electrically connecting the contact electrodes to the terminal electrodes with the conductive adhesive.

2. The method of claim 1, further comprising the steps of:

forming soldering paste on the contact electrodes of the chip package or the multi-chip module by a printing method or a transferring method;

fixing soldering balls having a higher melting point than solder contained in said soldering paste to said contact electrodes; and melting said soldering paste, thus forming ball-type protruded electrodes and using said ball-type protruded electrodes as said contact electrodes to which the conductive adhesive is applied.

3. The method of claim 1, wherein the conductive adhesive for checking operation is formed by a printing method or a transferring method.

4. The method of claim 1, wherein the conductive adhesive for checking operation is formed by dipping the contact electrodes in a reservoir of the conductive adhesive.

5. The method of claim 1, wherein the conductive adhesive for checking operation contains conductive filler, thermoplastic resin and solvent, the method further comprising the step of heating to drive off the solvent when the contact electrodes are in contact with the terminal electrodes of the checking device.

6. The method of claim 1, wherein the chip carrier comprises at least one substrate material selected from the group consisting of alumina, ceramics and resin.

7. The method of claim 1, wherein terminal electrodes are formed on a surface of the chip carrier for mounting the LSI chip; wherein the contact electrodes are formed on a surface opposite to a surface formed with the LSI chip for mounting on a circuit substrate; and wherein circuits of said terminal electrodes of the chip carrier and said contact electrodes are connected at a substrate internal conductor.

8. The method of claim 1, where terminal electrodes are formed on a surface of the chip carrier and the LSI chip is mounted on the terminal electrodes on the chip carrier with a bonding layer in-between, facing said terminal electrodes of the chip carrier.

9. The method of claim 6, wherein the bonding layer comprises at least one material selected from the group consisting of conductive adhesive, solder and anisotropic conductive material.

* * * * *